United States Patent

Young et al.

[11] Patent Number: 5,903,106
[45] Date of Patent: May 11, 1999

[54] PLASMA GENERATING APPARATUS HAVING AN ELECTROSTATIC SHIELD

[75] Inventors: Lydia J. Young, Palo Alto; Vojtech Pacak, Scotts Valley, both of Calif.

[73] Assignee: WJ Semiconductor Equipment Group, Inc., Scotts Valley, Calif.

[21] Appl. No.: 08/971,316

[22] Filed: Nov. 17, 1997

[51] Int. Cl.$^6$ ........................................ H01J 7/24
[52] U.S. Cl. .................. 315/111.41; 315/111.51; 118/623; 204/298.11
[58] Field of Search .................. 315/111.21, 111.41, 315/111.51, 111.71; 118/623, 723 I; 204/298.08, 298.16, 298.11; 156/345

[56] References Cited

U.S. PATENT DOCUMENTS

| | | | |
|---|---|---|---|
| 4,918,031 | 4/1990 | Flamm et al. | 437/225 |
| 5,122,251 | 6/1992 | Campbell et al. | 204/298.06 |
| 5,234,529 | 8/1993 | Johnson | 156/345 |
| 5,433,812 | 7/1995 | Cuomo et al. | 156/345 |
| 5,534,231 | 7/1996 | Savas | 216/67 |
| 5,537,004 | 7/1996 | Imahashi et al. | 315/111.21 |
| 5,540,800 | 7/1996 | Qian | 156/345 |
| 5,554,223 | 9/1996 | Imahashi | 118/723 I |
| 5,556,501 | 9/1996 | Collins et al. | 156/345 |
| 5,560,776 | 10/1996 | Sugai et al. | 118/723 AN |
| 5,597,439 | 1/1997 | Salzman | 156/345 |
| 5,614,055 | 3/1997 | Fairbairn et al. | 156/345 |
| 5,618,382 | 4/1997 | Mintz et al. | 216/64 |
| 5,647,913 | 7/1997 | Blalock | 118/723 I |
| 5,792,272 | 8/1998 | Van Os et al. | 315/111.51 X |

OTHER PUBLICATIONS

Popov, Oleg A., "High Density Plasma Sources: Design, Physicsa and Performance", Noyes Publications, Ch. 3, pp. 100–133.

*Primary Examiner*—Don Wong
*Assistant Examiner*—Haissa Philogene
*Attorney, Agent, or Firm*—Flehr Hohbach Test Albritton & Herbert LLP

[57] ABSTRACT

A plasma generating source for processing semiconductor integrated circuits is provided. The plasma generating source is configured to control the amount of electromagnetic energy and the distribution of the electric and magnet energies coupled to the plasma. The plasma generating source comprises a plasma containing region and a source of electromagnetic energy for generating a plasma. An electrostatic shield is disposed between the source of electromagnetic energy and the plasma containing region. The electrostatic shield has a plurality of openings therethrough configured to control the amount and distribution of electromagnetic energy coupled from the source into the plasma containing region. The openings may be configured in a variety of ways to control the magnitude and distribution of electromagnetic energy coupled to the plasma.

49 Claims, 11 Drawing Sheets

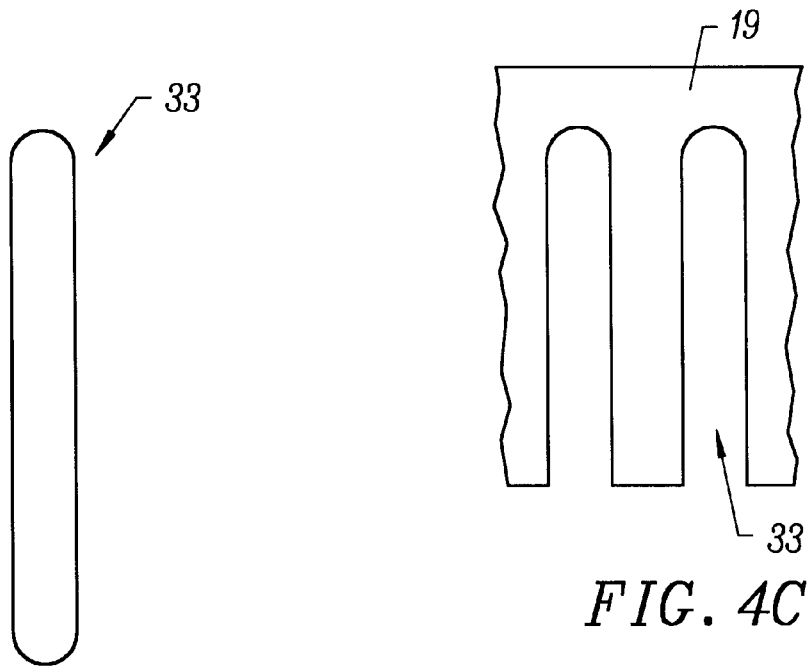
FIG. 4A
FIG. 4C
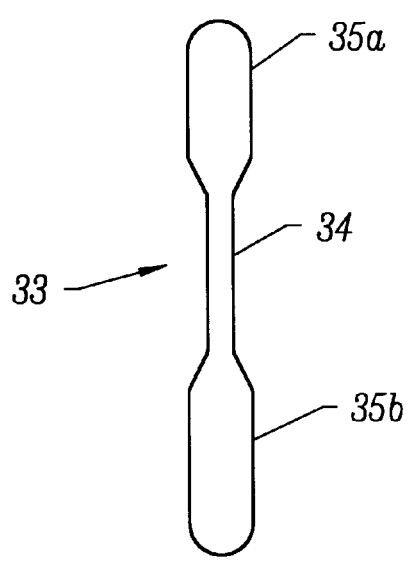
FIG. 4B

PLASMA GENERATING APPARATUS HAVING AN ELECTROSTATIC SHIELD

BRIEF DESCRIPTION OF THE INVENTION

This invention relates to plasma generating sources used for processing semiconductor integrated circuits. More particularly, the invention relates to a plasma generating source having an electrostatic shield that is configured to control the amount of electromagnetic energy and/or the distribution of the electric and magnetic energies coupled to the plasma.

BACKGROUND OF THE INVENTION

The processing of semiconductor wafers and other integrated circuits (IC) includes critical manufacturing steps such as etching wafer surfaces and depositing layers of material on wafer surfaces to form device components, interconnecting lines, dielectrics, insulating barriers and the like. Various systems have been employed to deposit layers of material and the like on the surface of integrated circuits, and often such layers are formed by chemical vapor deposition (CVD). A conventional thermal CVD process deposits a stable chemical compound on the surface of a wafer by thermal reaction of certain gaseous chemicals. Various CVD reactors have been used in the art including low pressure CVD systems and atmospheric pressure CVD systems.

More recently, plasma enhanced (sometimes called plasma assisted) CVD systems (PECVD) have been developed. PECVD systems generally operate by disassociation and ionization of gaseous chemicals. The high electron temperatures associated with the plasma increase the density of the disassociated species available for deposition on the water surface. Accordingly, such systems are able to operate at lower temperatures than conventional thermal CVD systems. Such lower temperature processes are desirable and minimize diffusion of shallow junctions and inter-diffusion of metals contained within the integrated circuits. Moreover, PECVD systems are suitable for forming multiple dielectric layers to be used to isolate stacked device features as device densities increase. When forming such multilayer dielectric layers it is desirable to provide a layer with good gap fill, isolation, stress and step coverage properties. These properties become more difficult to attain as device dimensions shrink.

To address the continual need for reactors capable of producing high quality wafers with increasing smaller device features, high density plasma (HDP) CVD (HDP-CVD) systems have been developed. HDP-CVD systems employ a plasma generating source capable of producing a high density of ions, typically on the order of $10^{11}$ plasma ions/cm$^3$ and above. Various types of plasma generating sources have been reported in the prior art. One example of a plasma generating source is found in U.S. Pat. No. 4,918,031 which discloses an electrostatically shielded RF (ESRF) plasma generating source. The source has one longitudinally split, metallic shield disposed within a helical coil. An elaboration of the '031 patent is found in U.S. Pat. No. 5,234,529, which employs a plurality of longitudinal slots formed in the shield. The shields have been used in the art to suppress the amount of capacitive coupling between the plasma source (i.e. the RF coil and the like) and a plasma region, maximizing the inductive coupling to capacitive coupling ratio. The shield exposes only a small area of the plasma source to the plasma region, thus limiting substantially the capacitive component of the coupling of the electromagnetic energy into the plasma generating region. It is generally believed in the prior are teachings that capacitive coupling may increase the possibility of damage to the semiconductors being processed, and these teachings thus indicate the need for pure or near pure inductive coupled plasma.

It has bean found by the inventors that limiting the capacitive coupling through the shield creates a number of significant problems. First, ignition of the plasma generating source is very difficult and often times requires the use of supplementary igniters. For example, a spark coil, a low power RF bias shield, or even a low power start sequence using the wafer support bias power is needed to ignite the plasma generating source. The addition of such supplementary igniter components, as well as matching networks necessary for their power coupling, increases the complexity, cost and inefficiency of the system.

The '529 patent attempts to address the ignition problem by varying, the area of the slots by using two concentric cylindrical shields, disposed one behind the other, that move to vary the exposed area and increase the capacitive coupling. Such an arrangement is cumbersome and increases the mechanical complexity and cost of the source. Further the effect of varying the area of the slots can even lead to such detuning of the source that the matching network cannot correct the change of the source input impedance and the resonant frequency.

Another problem associated with plasma generating sources in general, is obtaining uniform distribution of the plasma across the wafer to be processed. Prior art systems typically employ supplemental magnetic sources at various points in the reactor to confine and distribute the plasma. For example, a dc coil placed below the plasma generating source and close to the wafer, or a system of two coils, or an array of permanent magnets may be used. Again, such arrangements increase the complexity and cost of the system. Moreover, the inventors have reason to believe that supplementary magnetic fields can actually have an adverse effect and cause a worsening of deposition uniformity.

A further issue with plasma generating sources is the ion density achievable by the source. There is continued interest in the pursuit of ever higher plasma densities to address the unyielding efforts to shrink device dimensions. The conventional plasma source as taught by the prior art with the electrostatic shield, always limits to some degree the ion density achievable by the source. To achieve greater ion densities, the inventors have found that it is desirable for the plasma generating source to have the effective radiating length of the slots in the shield extended into the high current region of the source. By doing so, the inductive coupling from the source into the plasma is greatly increased, while keeping the undesirable capacitive coupling unchanged.

Semiconductor processing requires that the plasma generating source be capable of operating over a wide pressure range. During processing of a wafer, the plasma source and reactor operate at very low pressures on the order of 10 mTorr and less. During cleaning of the reactor however, the source will operate at pressures of up to 1.0 Torr and above. Cleaning of the reactor plays an important role in the effective operation of a system. The highly reactive species deposit on the walls of the chamber, and the operating components, as well as on the surface of the substrate. Such deposits affect the operation of the system, may affect the plasma potentials within the system, and are a serious source of particulates which may end up contaminating the film deposited on the wafer. Accordingly it is advantageous that the plasma source operate over a wide pressure range.

Thus, it is desirable to provide a plasma generating source that addresses the foregoing problems; such as, a source that is capable of self-ignition, operates over a large pressure range, and achieves high ion density, while at the same time keeping the capacitively coupled component of the electromagnetic energy as low as possible and increasing the inductively coupled component. It would be particularly advantageous to provide a source that promotes uniform plasma distribution, and uniform qualities in the resultant deposited film.

OBJECTS AND SUMMARY OF THE INVENTION

Accordingly, it is an object of this invention to provide a plasma generating apparatus for processing semiconductor wafers and integrated circuits.

More particularly, it is an object of this invention to provide an improved plasma generating apparatus having an electrostatic shield for processing wafers that is configured to control the total amount of electromagnetic energy coupled to the plasma, and increase the portion of the energy coupled inductively.

Another object of this invention is to provide a plasma generating apparatus having an electrostatic shield which is capable of self ignition and of operating over a wide pressure range.

Another object of the present invention is to provide an electrostatic shield that is configured to assist in the control of plasma uniformity within the plasma containing region.

Yet another object of the invention is to provide a plasma generating apparatus that exhibits increased ion density.

A related object of this invention is to provide a plasma generating apparatus that improves the quality of films deposited on wafers.

The inventors have discovered that the foregoing problems stated in the Background are addressed by a plasma generating apparatus configured to control the amount of electromagnetic energy and/or the distribution of the electric and magnetic energies coupled to the plasma region. By controlling the magnitude of the electromagnetic field energy and the ratio of the electric to magnetic field energies coupled from the source to the plasma region, the apparatus can configure the resultant electric (E) and magnetic (H) fields and their ratio (E/H) inside the plasma region. The inventors have discovered that the magnitude and ratio of the fields have a variety of effects on the operation of the HDP-CVD system, including the temperature inside the plasma containing region particularly along the wall of the region), the distribution of the plasma, the ion density of the plasma, and the apparatus' capacity for self ignition.

These and other objects are achieved by a plasma generating apparatus herein disclosed comprising a plasma containing region and a source of electromagnetic energy for generating a plasma within the plasma containing region. An electrostatic shield is disposed between the source of electromagnetic energy and the plasma containing region. The electrostatic shield has a plurality of openings therethrough configured to control the amount and distribution of electromagnetic energy coupled from said source into the plasma containing region. A number of embodiments are provided in which the openings are configured in a variety of ways to control the magnitude and distribution of electromagnetic energy coupled to the plasma thereby affecting the temperature, plasma uniformity and plasma density of the system.

BRIEF DESCRIPTION OF THE DRAWINGS

Other objects and advantages of the invention become apparent upon reading of the detailed description of the invention and the appended claims provided below, and upon reference to the drawings in which:

FIGS. 4a–c show enlarged views of three different opening patterns according to three embodiments of the present invention.

DETAILED DESCRIPTION OF THE INVENTION

Figure 1A:
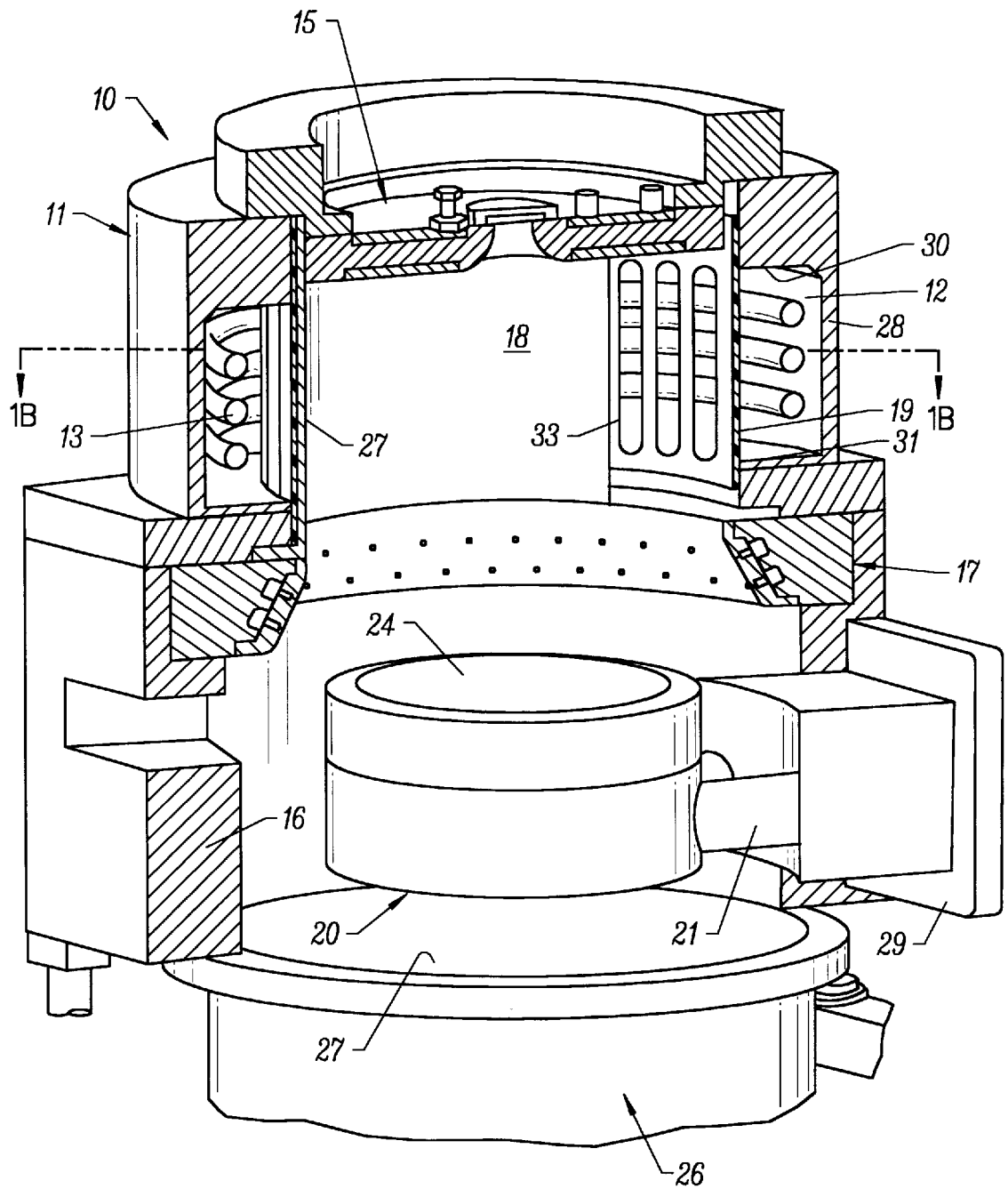
FIG. 1a is a partially broken away cross-sectional perspective view of a reactor having a plasma generating apparatus according to one embodiments of the present invention.
Figure 1B:
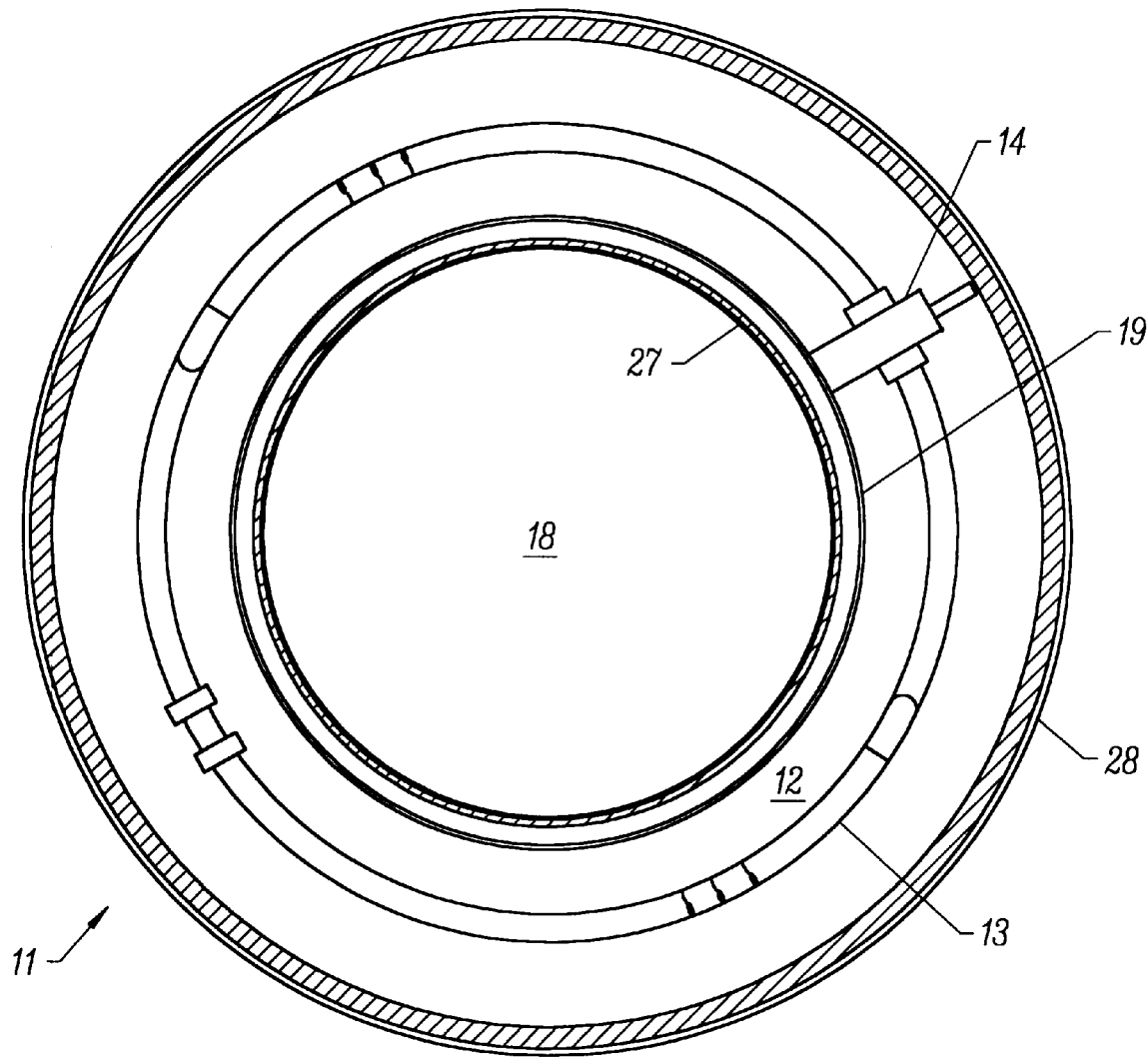
FIG. 1b is a cross-sectional bottom plan view of the plasma generating apparatus of FIG. 1a taken along section lines B—B.

Turning to the drawings, wherein like components are designated by like reference numbers in the figures, FIGS. 1a and 1b represent an exemplary HDP-CVD reactor with a plasma generating apparatus in accordance with one embodiment of the present invention. FIG. 1a shows a partially broken away cross-sectional perspective view of the reactor 10 having a plasma generating apparatus 11 operatively attached to process chamber 16. Process chamber 16 generally includes a gas injection manifold 17, which is mounted to process chamber 16, for receiving at least one gaseous chemical via gas delivery lines (not shown). Positioned within chamber 16 is a horizontal wafer support 20 (often referred to as a "chuck") for supporting a wafer 24. A wafer 24 is placed on the wafer support 20 whereby the surface of the wafer 24 is facing upwards. The wafer support 20 may be biased by applying r.f. energy from a generator (not shown) via a matching network (not shown). A vacuum system 26, having an opening 27, is provided for exhausting the reactor 10. A vacuum pump (not shown) is operatively coupled to the process chamber 16. It should be understood by those of skill in the art that while an exemplary reactor is shown, the present invention may be employed in other types of reactors. Additionally, while the plasma generating source of the present invention is best suited for HDP-CVD systems, the invention may be employed in any plasma system such as PECVD systems and etching systems.

Figure 2:
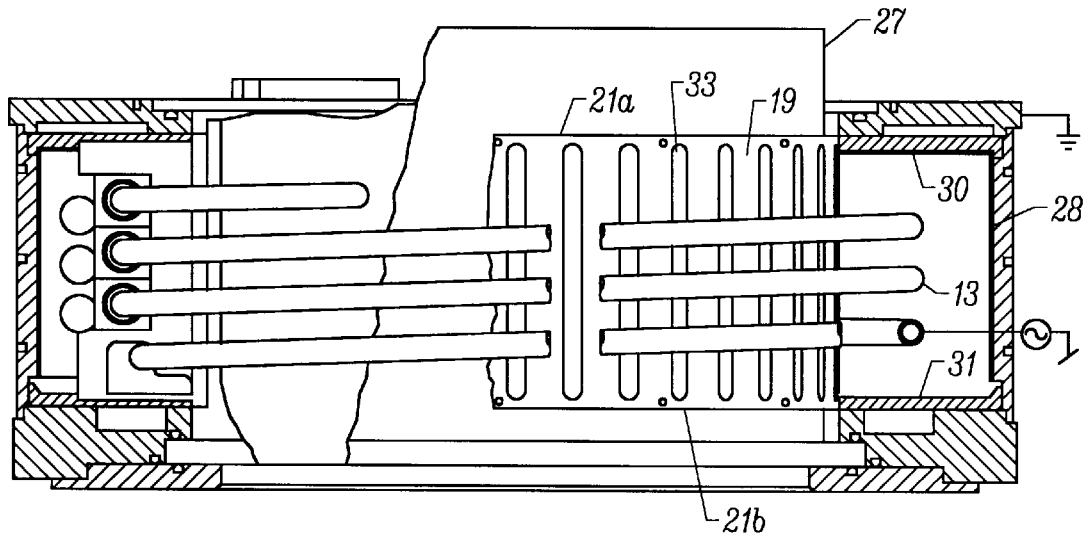
FIG. 2 illustrates a semi-cross sectional cut away view of the plasma generating apparatus shown in FIG. 1a according to one embodiment of the present invention.

Referring additionally to FIGS. 1b and 2, the plasma generating apparatus 11, commonly referred to as a "plasma source" is shown. The plasma generating apparatus 11 is comprised of an enclosure which includes an inner wall 27, and outer, upper and lower walls, 28, 30 and 31, together forming a cavity 12 therebetween. The inner wall 27 is cylindrical and has an interior which forms a plasma containing region 18. Disposed within the cavity 12 is a source of electromagnetic energy 13 for generating a plasma within the plasma containing region 18. Preferably the source of electromagnetic energy is a helical coil 13. A cover 15 is disposed at the top of the plasma containing region 18 to form the top of the plasma generating apparatus. The cover 15 may be a flat plate, a domed shaped surface, or any other suitable cover. Alternatively, a top gas injection manifold may be disposed at the top of the plasma containing region 18 to form the top of the plasma generating apparatus, and used to convey at least one gaseous chemical to plasma containing region 18. Preferably the plasma source 11 is cylindrical and is of the type classified in the art as inductively coupled plasma (ICP).

The plasma source 11 further includes a cylindrical slotted electrostatic shield 19 (also referred to as a "shield") made of a nonmagnetic material, the shield 19 being generally disposed in the cavity 12 between the coil 13 and the inner wall 27. To provide grounding of the shield, the shield 19 is attached to the outer wall 28 of the plasma source 11 via screws or spring loaded contacts 14. For practical applications the shield 19 is electrically referenced to the enclosure, and typically the electrical reference is ground. However, there may be applications where the electrical reference may be set at some nonzero potential. Preferably, the inner wall 27 is a liner made of a low loss dielectric material, such as quartz or high purity ceramic, and the upper, lower and outer walls 28, 30 and 31, and the shield 19 are comprised of a nonmagnetic high conductivity metal. The liner 27 is generally cylindrical and forms the wall exposed to the plasma containing region 18.

Figure 3:
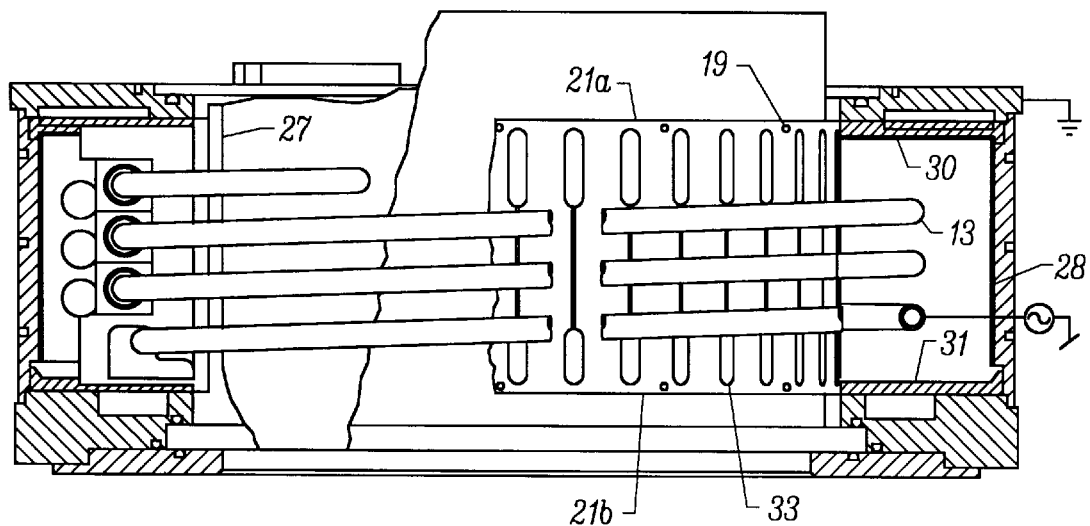
FIG. 3 illustrate a semi-cross sectional cut away view of the plasma generating apparatus according to an alternative embodiment of the present invention.

Of particular advantage, the electrostatic shield 19 has a plurality of elongated openings 33 formed therein. As shown in FIGS. 1a, 2 and 3 the openings 33 are longitudinally extending and circumferentially spaced around the shield 19. According to prior art teachings, electrostatic shields are used to decouple the electric field energy between the source and the plasma region. As discussed above in the Background to the invention, the inventors have found the prior art electrostatic shields to be inadequate. The inventors have discovered that the foregoing inadequacies are addressed by the plasma generating assembly of the present invention which is configured to control the amount and distribution of electromagnetic energy coupled to the plasma region. By controlling the amount and distribution of electromagnetic energy coupled to the plasma region 18, the magnitude of the generated electric (E) and magnetic (H) fields, and the ratio of the electric to magnetic (E/H) fields may be controlled. The inventors have discovered that the magnitude and ratio of the fields have a variety of effects on the operation of the HDP-CVD system, including the temperature inside the plasma containing region (particularly along the wall of the liner 27), the distribution of the plasma, the ion density of the plasma, and the apparatus' capacity for self ignition. Thus of great advantage, the present invention provides a plasma generating apparatus that is configured to control the coupling of the electromagnetic energy, thereby controlling the temperature, plasma distribution and plasma ion density within the plasma containing region, and enabling self ignition.

This is accomplished, according to the present invention, in the following manner: the shield 19 is configured to control the amount and distribution of electromagnetic energy coupled to the plasma by configuring the area of exposed to unexposed regions, and the placement of such exposed and unexposed regions, in the shield 19. Referring to FIGS. 2–6, four embodiments of the plasma generating apparatus 11 are shown. FIG. 2 shows a cross-sectional view of the plasma generating apparatus 11 according to one embodiment of the present invention, referred to as the "wide slot" embodiment. The liner 27 is cut away to clearly illustrate the shield 19 disposed between coils 13 and the liner 27. The shield may be coextensive with the length of the liner 27. Alternatively, the shield may extend only along a portion, or a substantial portion, of the length of the liner 27.

The shield 19 has top and bottom ends 21a and 21b, and formed within the shield 19 are a plurality of openings 33. The openings 33 are not drawn to scale in FIGS. 2–6, but are enlarged to show their detail. In the exemplary embodiment, the openings 33 are elongated and extend around the circumference of the shield 19. The openings 33 are of equal width and evenly spaced apart in this embodiment, however, as will be described in detail below, the openings may be formed of unequal width and spacing. The openings 33 may extend substantially between the ends 21a and 21b of the shield 19. Alternatively, the openings 33 may extend only along a portion of the length of the shield 19, instead of substantially between the ends. Note that this configuration where the openings do not extend through the ends is also referred to as a "closed-ended shield."

Of particular advantage, the plasma generating apparatus shown in FIG. 2 is configured for coupling of increased amounts of electromagnetic energy. Specifically, the apparatus is configured for increased capacitive coupling from the plasma generating apparatus 12 to the plasma region 18. The shield contains openings that are wide as compared to the prior art teaching, such wide openings provide greater exposure to the coils and thus a greater amount of electromagnetic energy is capacitively coupled to the plasma region 18. The shield has an exposed area (i.e. the area of the openings 33) in the range of approximately 20% to 50% of the total area of the shield 19, preferably from 20% to 40%, with an exposed area of 30% being most preferred. In an exemplary embodiment, approximately 36 openings are formed in the shield 19, and are spaced apart at approximately 1.0 inch. Each of the 36 openings has a width of approximately 0.63 inches. The openings 33 are more clearly illustrated in FIG. 4a, an enlarged cross-section view of one opening. The increased exposed area demonstrates significant advantages, it especially enables the apparatus to be self igniting and to operate at elevated pressures.

An alternative embodiment of the plasma generating apparatus is shown in FIG. 3, a cross-sectional view of the plasma generating apparatus 11 according to a second embodiment of the present invention, referred to as the "hour-glass" embodiment. Again, the liner 27 is cut away to clearly illustrate the shield 19. The shield 19 is disposed between coils 13 and the liner 27 and contains a plurality of openings 33 formed therein. In this hour-glass embodiment, the plasma generating apparatus is configured to couple a lesser amount of electromagnetic energy because of smaller capacitive coupling in a central region than in the wide embodiment shown in FIG. 2. In the hour-glass embodiment, the openings 33 are elongated and extend around the circumference of the shield 19. The openings 33 are evenly spaced apart and extend substantially between the end surfaces 21a and 21b. Alternatively, the openings may extend only along a portion of the length of the shield 19. Further the placement of the openings 33 may vary azimuthally, that is the openings may be spaced in an un-even manner around the circumference of the shield 19. In this embodiment, however, the openings 33 are not of constant width. The openings 33 are more clearly illustrated in FIG. 4b, an enlarged cross-section view of one opening. The openings 33 are not of uniform width but instead have a narrow elongated middle region 34, disposed between two enlarged regions 35a and 35b at the ends of the opening 33. In this embodiment, the distribution of the electromagnetic energy coupled is changed by decreasing the level of capacitive coupling between the coil and the plasma in the middle region of the shield 19 by the narrow elongated region 34 of the opening 33. The shield has an exposed area in the range of approximately equal to or less than 40% of the total area of the shield 19, preferably from 15% to 40%, with an exposed area of 30% being most preferred. In an exemplary embodiment, approximately 36 openings are formed in the shield 19, and are evenly spaced apart, at approximately 1.0 inch for this exemplary embodiment, each of the 36 openings has the following dimension: the width of end sections 35a and 35b are each approximately 0.63 inches, and the width of the middle region 34 is approximately 0.06 inches. The length of the end sections may be the same or different, and in the exemplary embodiment the length of end sections 35a and 35b are each approximately 1.5 and 1.25 inches respectively, and the length of the middle region 34 is approximately 1.75 inches. Wile certain dimensions are given, it is to be understood that other dimensions and spacings and placement of the openings may be used to configure the shield to a achieve a desired effect.

Figure 5:
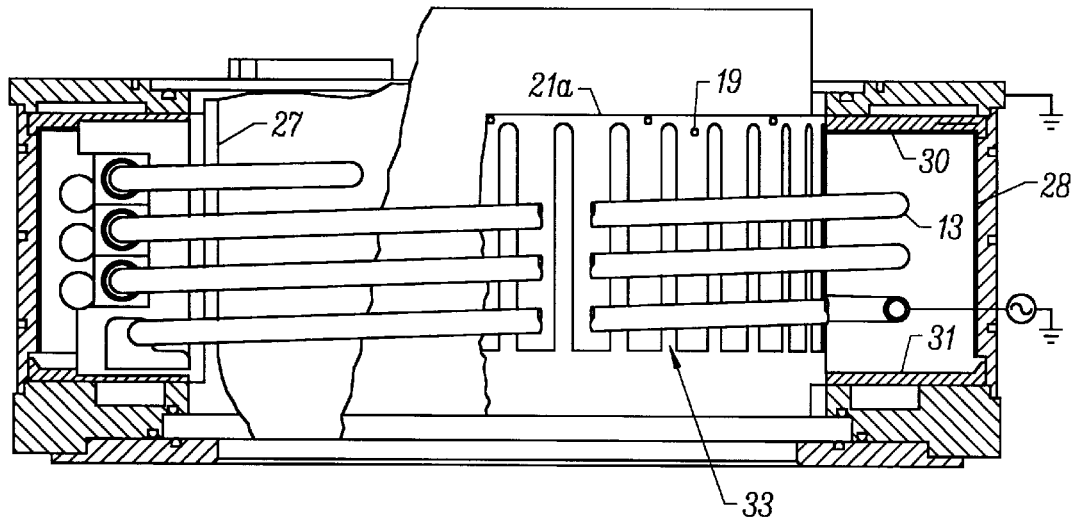
FIG. 5 is a semi-cross sectional cut away view of the plasma generating apparatus according to another alternative embodiment of the present invention
Figure 6:
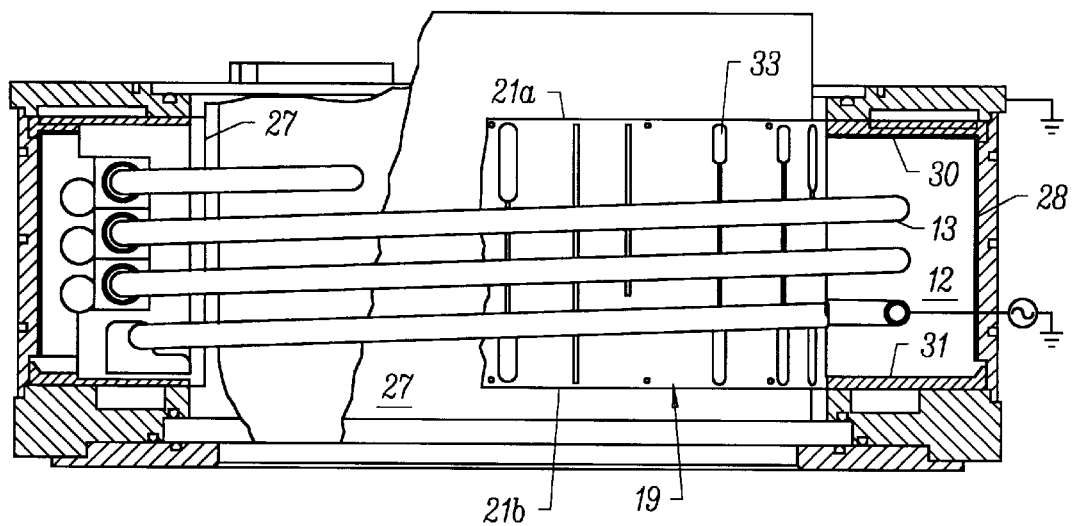
FIG. 6 is semi-cross sectional cut away view of the plasma generating apparatus according to yet another embodiment of the present invention.

Yet another embodiment of the plasma generating apparatus is shown in FIG. 5, a cross-sectional partial cut away view of the plasma generating apparatus according to a third embodiment of the present invention, referred to as the "open-ended" embodiment. Again, the liner 27 is cut away to clearly illustrate the shield 19. The shield is disposed between coils 13 and the liner 27. In this open-ended embodiment, a plurality of elongated openings 33 are formed in the shield and extend around the circumference of the shield 19, but in this instance one end of the openings extend through to the bottom surface 21b of the shield to form the "open" ended shield. Additionally, the bottom surface 21b of the shield 19 may extend only along a portion of the length of the liner 27, thereby leaving all or a portion of one or more coils exposed. It is important to note that the end of the shield that is "open" has to be facing the high current end of the coil (i.e. the grounded end of the coil). In this case the coil is grounded to the bottom wall 31 of the enclosure. The end of the shield that is facing the other end of the coil (i.e. the tip of the coil or low current end) is attached (i.e. grounded) to the body of the chamber. Thus, in this case the top end 21a of the shield is attached to the top wall 30 of the enclosure. The position of the open end of the shield depends on which end of the coil is grounded (high current), and thus could be orientated either at the bottom or the top of the shield. Consequently, in this open-ended embodiment, the plasma generating apparatus is configured to couple a greater amount of electromagnetic energy inductively than the embodiments described above. Specifically, the shield has an exposed area in the range of approximately 5% to 40%, preferably from 5% to 30%, with an exposed area of 20% being most preferred. In the exemplary embodiment shown in FIG. 5, the openings 33 are of constant width of approximately ⅛ to ½ inch. Approximately 36 openings are formed in the shield 19 and are evenly spaced apart at approximately 1.0 inch. Alternatively, the openings may vary in width and/or spacing, and the openings may have the shape of the openings in the hour-glass embodiment and having either the narrow middle portion, or the wide end portion, terminate at the end surface 21b. In yet another alternative embodiment, some of the openings may extend through one end surface, while other openings may expend only between a portion, or a substantial portion, of the two end surfaces. All of the different opening 33 patterns described above have the unifying purpose of controlling the amount and location of electromagnetic energy coupled to the plasma.

The attachment of the open-ended shield is important and this exemplary embodiment, the top end 21a of the shield is attached to the outer wall 28 of the plasma source 12. The bottom end 21b of the shield having the openings 33 extending therethrough, i.e. the "open end," is suspended and not attached to any surface. Thus, the shield 19 is grounded to the plasma source 12 at its closed end, i.e. in this case the top end 21a, facing the open (low current) end of the coil.

This embodiment of the invention provides a particular advantage which can be understood by some description of what happens when the shield is grounded on both its ends. The shield that is grounded on both of its ends as taught by the wide and hour-glass embodiments above is of significant advantage over the prior art, however being grounded on both ends has an effect of effectively shorting the radiating lengths of the openings. The openings are in fact short-circuited on either side of the shield, and the RF surface current flows easily around the shield on the high conductivity metal. This in turn limits the amount of inductive coupling of electromagnetic energy into the plasma. The inventors have addressed this effect by extending at least one of the openings all the way through the one end of the shield that is facing the high current (i.e. grounded) end of the helical coil, and by breaking the electric connection between this end of the shield and the ground. In this particular shield embodiment (i.e the open ended shield) the azimuthal electric field developed across the opening is not shorted at the end of the opening (which is now open) and thus, the inductive coupling of the electromagnetic energy is increased. At the same time, there is no significant increase in capacitive coupling between the coil and the plasma, because the open gap created between the shield and the source body is near the "low potential" (i.e. low voltage) end of the helical coil. Moreover of great advantage, the inventors have discovered that in all of the embodiments of the present invention, by placing the high current end of the helical coil at the bottom of the coil which is closer to the wafer surface 24 than the top of the coil, brings the point of plasma density closer to the wafer surface 24. This improves the quality of films deposited on wafers.

Thus, preferably, the open end of the shield 19 which is unattached to the plasma source body is oriented to correspond in position with respect to the high current (i.e. grounded) end of the coil 13, and that this position will be placed at the bottom end 21b of the shield 19 which is closest to the wafer surface 24. Of particular advantage, configuring the plasma apparatus 11 with an open end of the shield 19 concurrent with the high current (i.e. grounded) end of the coil 13 has an effect equivalent to the increasing the effective radiating length of the slots 33, which in turn increases the inductive coupling between the source and the plasma generating region. Configuring the apparatus in such a manner increases the plasma density and greatly increases the ability of the source to ignite the plasma. The higher plasma density manifested itself by increased wafer temperature when compared to the temperature achieved with the closed-ended shield. Also, with the open-ended shield, the source is able to ignite a plasma with much narrower openings that the source having the closed-ended shield configuration. This allows one to take full advantage of the screening effect of the shield without compromising the plasma ignition performance of the source.

Of particular advantage, the present invention provides a plasma generating apparatus that is configured to control the amount and distribution of electromagnetic energy coupled from the plasma source to the plasma containing region. The inventors conducted many experiments to evaluate electric and magnetic field distribution and relative intensities and configuring the plasma generating apparatus to control the electromagnetic energy and resulting field distribution and magnitude to give the most desired effects on temperature, plasma uniformity and ion density.

A number of experiments were conducted using an experimental plasma apparatus. A plasma generating apparatus having a helical coil as its source of electromagnetic energy was used. In this particular experiment, the helical coil was grounded on its upper end (i.e. at upper wall 30). Disposed between the coil and the plasma containing region, a shield having openings comprised of five vertically aligned holes. Thirty six columns of holes were formed around the circumference of the shield, thereby forming five circular hole arrays around the circumference. The hole arrays were numbered 1–5. Holes were used as opposed to elongated openings so that data could be collected at exact vertical and azimuthal positions around the shield. The azimuthal distance between two adjacent holes (in one circular hole array) was 10 degrees and the vertical distance between holes was 0.9" (i.e. the distance between each circular hole array) with the middle circular hole array (array #3) placed in the vertical center of the shield. To measure the electric and magnetic field intensity, a simple probe (antenna) and a miniature loop were used. By using the loop, the orientation of the magnetic field may be measured in addition to measurement of the intensity. Specifically, by rotating the probe such that the picked up signal is a maximum, the loop plane has to be oriented perpendicular to the magnetic field lines. Measurements were made using a Hewlett-Packard Network Analyzer Model 8753D.

Figure 7:
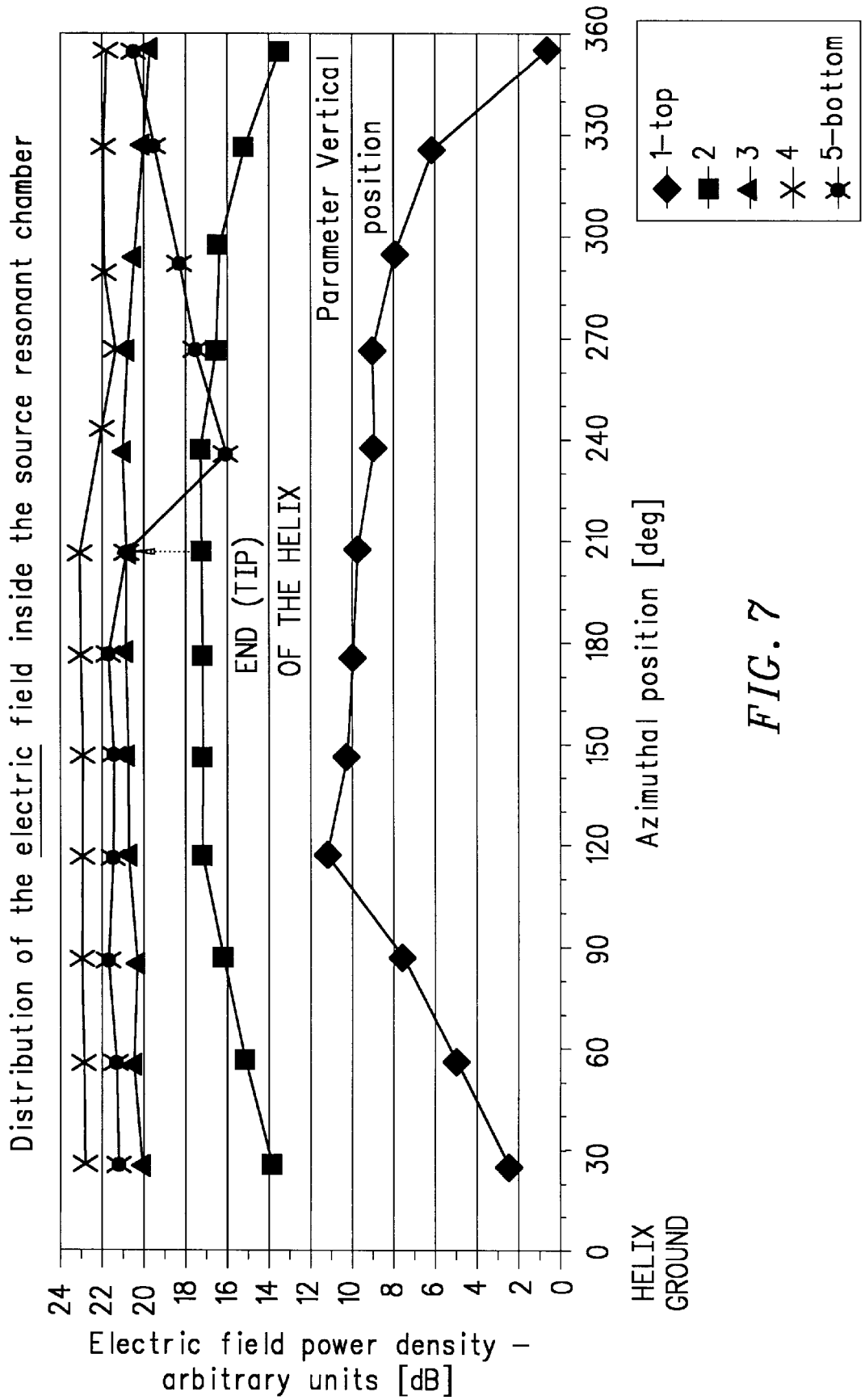
FIG. 7 is a graph of experimental data depicting the distribution of the electric field in the plasma region as a function of the azimuthal position along a cylindrical plasma generating apparatus in accordance with one embodiment of the present invention.

The distribution of the electric field inside the plasma generating source as a function of azimuthal position for various vertical positions along the shield are shown in FIG. 7. The area covered by the measurement is given approximately by the height of the shield and by the full circle azimuthally. The field intensity (y-axis) is plotted as the electric field power density in arbitrary units expressed in decibels. The lowest intensity of the electric field was set to zero. A difference of 6 dB is equivalent to doubling the filed intensities (or voltages and currents) or to quadrupling the power densities. Curves #1–#5 represent the position of the five circular hole arrays positioned vertically along the circumference of the shield.

The graph of FIG. 7 shows the electric field has its maximum value not at the very lowest circle of hole arrays (i.e. hole array or curve #5) which is the set closest to the open end of the helix coil, but rather has its maximum on the plane where hole array #4 (i.e. curve #4) is located which is 0.9" up from the bottom. With the exception of hole arrays #1 and #5, the electric filed is reasonably constant azimuthally about the shield. The sharp drop in field intensity on curve #5 at point "A" on FIG. 7 corresponds to the open end of the helix coil.

Figure 8:
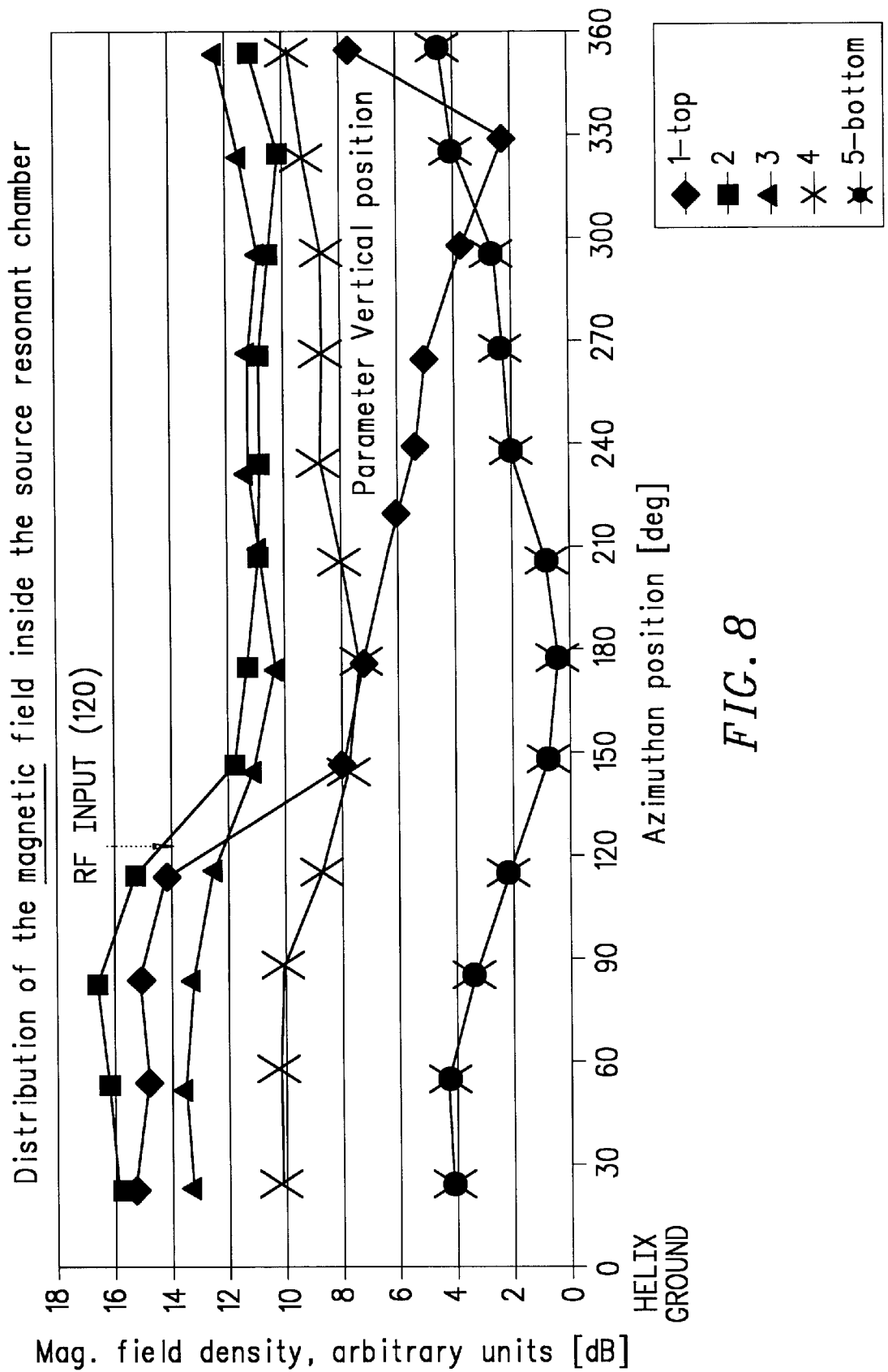
FIG. 8 is a graph of experimental data depicting the distribution of the magnetic field in the plasma region as a function of the azimuthal position along a cylindrical plasma generating apparatus in accordance with one embodiment of the present invention.

In FIG. 8 the distribution of the magnetic field is shown, and it is complementary to that of the electric field, with the absolute maximum near the helix coil ground point and minimum at the open end of the helix coil (which for this particular configuration is orientated at the bottom). Unlike the electric field distribution in FIG. 7, the magnetic field varies azimuthally with a distinctive maximum localized between the ground point and the rf input at 120°. The absolute maximum is not along the highest circle of holes array (i.e. hole array #1) which is the closest to the ground of the helix coil, but rather has its maximum on the plane where circular holes array #2 is located which is 0.9" down from the top. It is believed that the effect of the location of the rf input tap on the first turn of the helix is responsible for the field nonuniformity around circular holes array #1.

Figure 9:
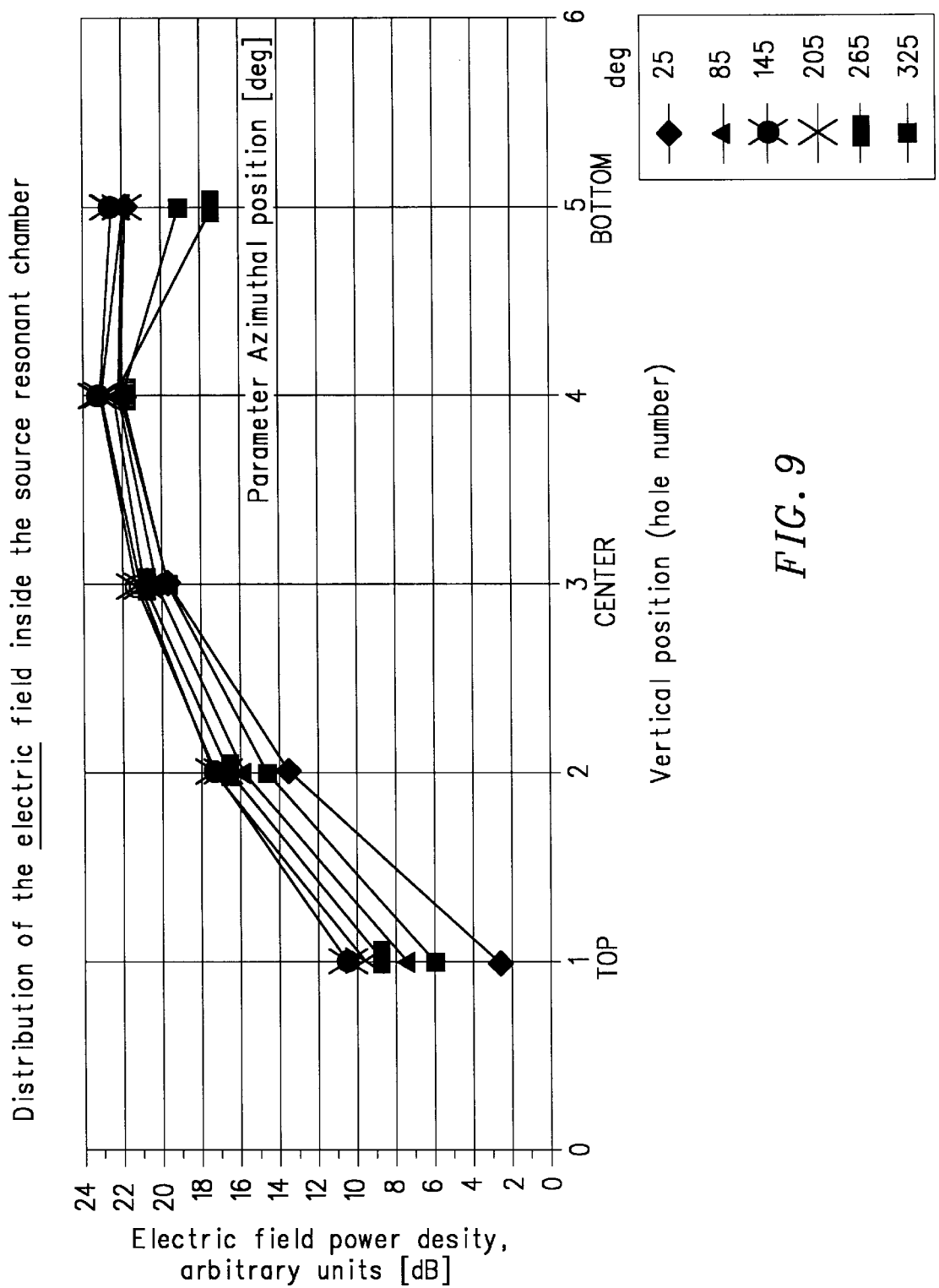
FIG. 9 is a graph plotting experimental data showing the distribution of the electric field in the plasma region as a function of vertical position along a cylindrical plasma generating apparatus in accordance with one embodiment of the present invention.
Figure 10:
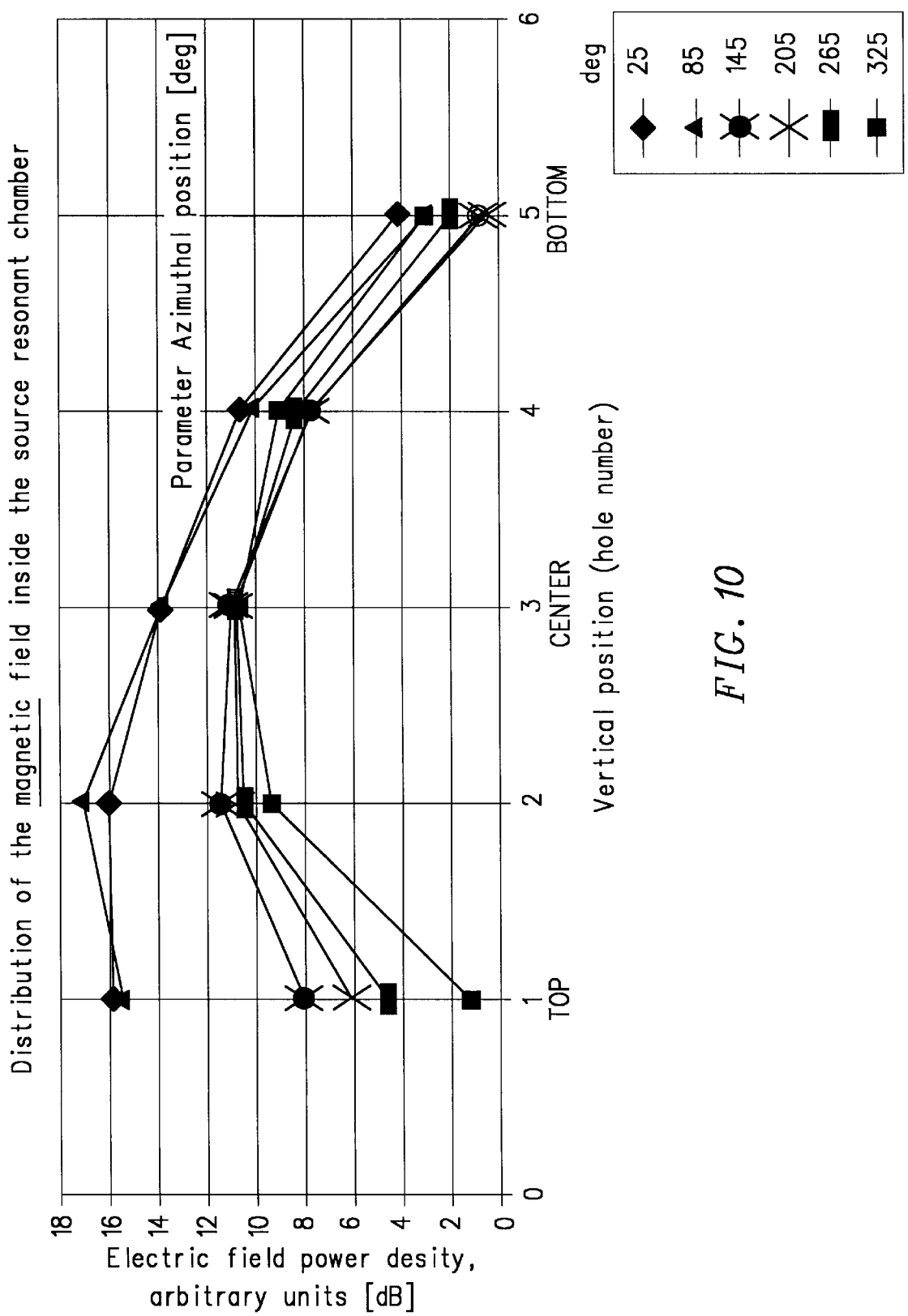
FIG. 10 is a graph plotting experimental data and showing the distribution of the magnetic field in the plasma region as a function of the azimuthal position along a cylindrical plasma generating apparatus in accordance with one embodiment of the present invention.

To further evaluate the electric and magnetic field distribution, both fields were plotted as a function of vertical position (i.e. circular hole array number) along the shield, with azimuthal position as the changing parameter. Results for the electric field and magnetic field are shown in FIGS. 9 and 10, respectively. The inventors discovered that the electric field peaks near the tip of the coil between hole array positions #4 and #5 (i.e. in the lower region in this particular case). By contrast, similar measurements of the magnetic field show it to be relatively well centered about the shield horizontal midplane, and not near the ground of the coil (the ground of the coil being in the upper region in this particular case). This finding explains why opening the shield at the side of the coil ground increases the level of inductive coupling between the source and the plasma generating region.

Given this discovery, the inventors concluded that the generated electric and magnetic fields are specific to the geometry of the plasma generating apparatus, particularly the electrostatic shield and the coil configuration. The present invention provides great advantage by providing a plasma generating apparatus configured to selectively control the manner in which electromagnetic energy is coupled to the plasma containing region. This allows the apparatus to configure the resultant electric (E) and magnetic fields (H) to control the magnitude of the fields and the ratio of the electric to magnetic field (E/H). The inventors have discovered that the magnitude and ratio of the fields have a variety of effects on the operation of the HDP-CVD system, including the temperature inside the plasma containing region (particularly along the wall of the liner 27), the distribution of the plasma, the ion density of the plasma, and the apparatus' capacity for self ignition. Thus, of great advantage, the present invention provides a plasma generating apparatus described above that is configured to control the temperature, plasma distribution and plasma ion density within the plasma containing region, and to enable self ignition It is also discovered that the plasma source itself, in this instance the helical coil, has certain field asymmetries. Hence, the plasma apparatus, particularly the shield, is configured to control the plasma uniformity in the plasma containing region, thereby providing more uniform processing of wafers. This is of significant advantage because according to the present invention the shield is configured as an additional control instrument to the HDP-CVD system for affecting the plasma uniformity. The various embodiments of the invention are configured to address the field non-uniformities in both the azimuthal and vertical directions. This is in great contrast to the simple function of limiting only the capacitive coupling between the source and the plasma as performed by the azimuthally uniform electrostatic shields of the prior art.

As described above, the present invention is configured to control the magnitude, and consequently the configuration of the resulting electromagnetic field. During operation of the system, the capacitively coupled electric field is oriented radially in the direction of the chamber walls of the source. This has an important effect on the resultant temperature wit the plasma containing region since ions can be carried along this E-field vector toward the walls and impinge on the walls which result in higher temperatures. En areas of high electric field magnitude, the temperature increases. These temperatures effects are particularly felt along corresponding regions of the liner 27 that forms the wall of the plasma containing region 28. During certain operations, such as cleaning of the reactor which requires relatively high pressures, the plasma is more concentrated within the plasma containing region 18. This gives rise to higher temperatures and higher temperature gradient along the liner 27. This problem may be addressed by controlling the capacitively coupled electromagnetic energy, and the present invention provides a plasma generating apparatus configured to reduce the capacitive coupling to the plasma in the region of greatest electric field intensity. As shown by FIG. 9, the radial electric field has its greatest intensity about the horizontal midplane of the shield. In one embodiment of the present invention (the hour-glass embodiment shown in FIG. 3) a plasma generating apparatus is provided with a shield having a narrow middle region with wide end regions. In this embodiment, the shield is configured to more uniformly distribute the electric field by limiting the amount of capacitive coupling of the electromagnetic energy to the plasma in the middle region, thereby decreasing the radial electric field in this region. The hour-glass embodiment shown in FIG. 3 is the preferred embodiment to address this problem. Of further advantage, the wide end openings in the hour-glass embodiment provide sufficient coupling of electromagnetic energy to enable to apparatus to be self igniting without the need for supplementary ignition means.

Figure 11:
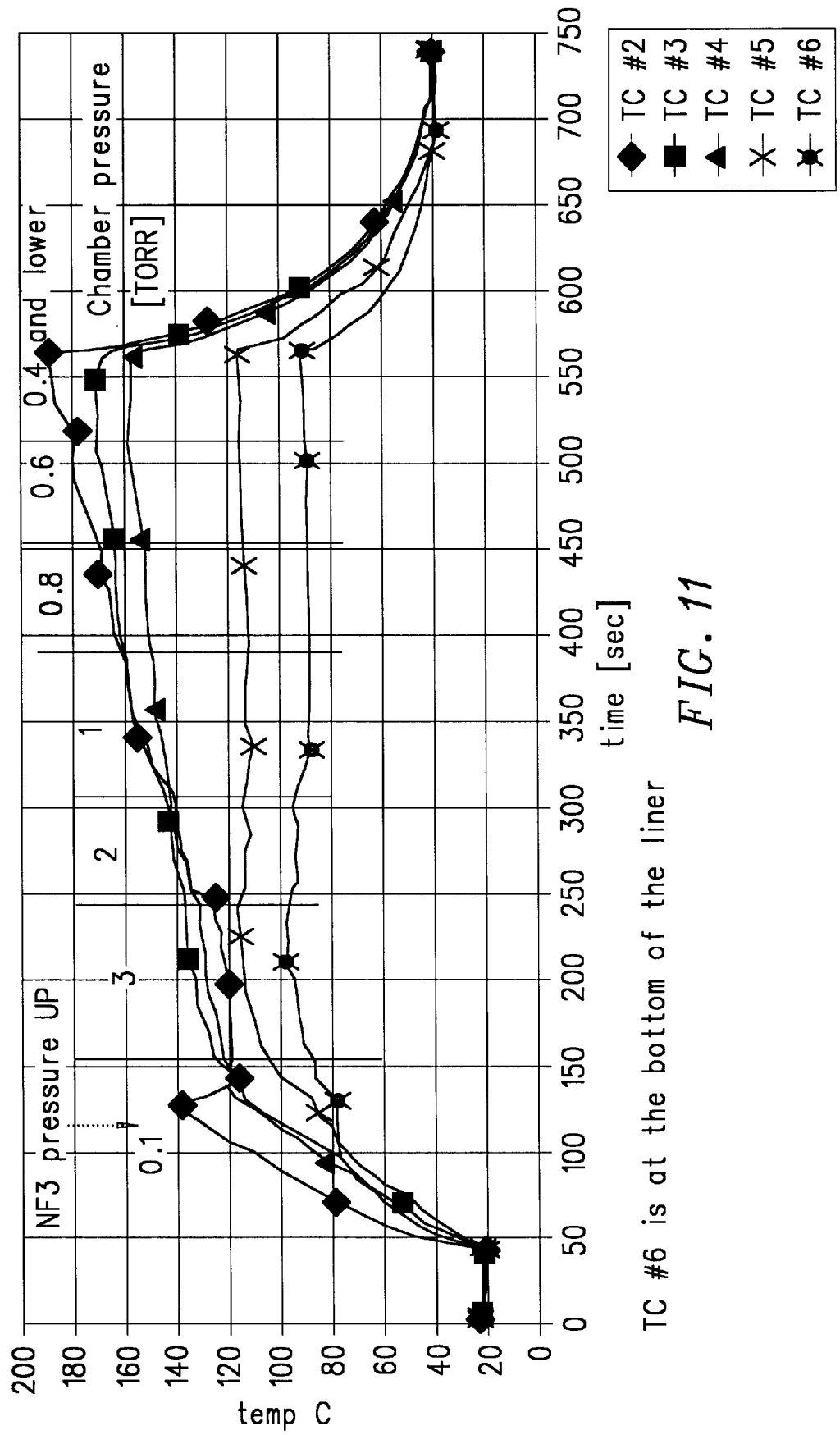
FIG. 11 is a graph plotting temperature as a function of time for a rapid increase of chamber pressure exhibited using one embodiment of the present invention.

A number of experiments were conducted evaluating the temperature of the liner 27 at various process pressures. An example of the results are shown in FIG. 11, a graph plotting temperature at certain positions along the vertical length of the liner as a function of time for a rapid increase of chamber pressure using the hour-glass embodiment of the present invention. Six thermocouples (TC's #1–#6) were placed along the vertical length of the liner with TC #6 located at the bottom of the liner. Note that TC #1 failed early in the experiment. The thermocouples were vertically spaced at approximately 0.9" apart. Azimuthal dependence of the liner temperature was probed by rotating the liner with embedded thermocouples relative to the helix. The pressure was rapidly increased in the plasma containing region by the introduction of $NF_3$ gas flow. This simulates the process conditions during cleaning operations. As shown in FIG. 11, the pressure was increased from 0.1 Torr to 3 Torr within 100 seconds and then slowly deceased to below 0.4 Torr. The temperature of the liner did not increase above 200 C., which is well within the thermal stability of the liner material. This presented result is in sharp contrast to a temperature distribution pattern obtained with the uniform wide opening shield. In the wide opening embodiment, a large temperature gradient across the liner existed for a much wider pressure range, from 0.5 Torr to 3 Torr.

The present invention also provides a plasma generating apparatus configured to increase the ion density achievable by the source. The inventors have also found that the plasma source generates a nonuniform plasma particularly due to the inherent electric asymmetry of the helical coil. This asymmetry can be seen in the distribution of the generated electric and magnetic fields. The area of maximum RF magnetic field in the plasma containing region corresponds to an area of the coil that exhibits maximum current. By configuring the plasma source assembly geometry, particularly the geometry of the electrostatic shield as to achieve a strong inductive coupling of the electromagnetic energy from the high current region of the coil, the ion density produced by the assembly is increased. An example of such a plasma assembly is the open-ended embodiment of the present invention shown in FIG. 5. Specifically, one end surface (21a or 21b) of the shield 19 has the openings 33 extending though the end surface such that the shield is "open ended" on that end. This end is configured to correspond to the high current region of the helical coil. By configuring the openings 33 to be open, the electric field across the openings near the open end, which is generated by the induced surface current on the shield, is greatly increased. Unlike the radially oriented electric field generated by the capacitive coupling, this electric field is solenoidal (azimuthal) and does not accelerate the plasma electrons toward the outer wall 28. Because the openings open end is located near the area of maximum current, such configuration efficiently increases the amount of inductively coupled electromagnetic energy into the plasma.

The apparatus of the present invention may be configured to negate, or compensate for, the asymmetries of the plasma source. Specifically, in the embodiment of the invention described in FIG. 6, the plasma generating apparatus 11 is configured to compensate for the asymmetries and provide a more uniform distribution of the electric fields (and thus the resultant plasma) within the plasma containing region. It is particularly important to control the plasma uniformity when an independent source of dc magnetic field (such as permanent magnets or a dc coil) is used because any inherent plasma source non-uniformity becomes more prominent when a dc magnetic field is applied. Referring again to FIG. 6, the shield 19 employs openings 33 of different width and spacing, and length. Wider openings are placed, thereby increasing the exposed area, where greater capacitive coupling of electromagnetic energy is desired. Narrower openings, or wider spacing between openings, are placed where less capacitive coupling is desired, such as in a region of high radial electric fields. The openings may be of the hour-glass shape, may be open ended, or may have a constant width depending on the magnitude and distribution of electromagnetic coupling desired. Moreover, the shield may be "blanked off" in certain regions, meaning that certain regions of the shield do not contain the openings. While one specific example is shown, it will be understood that many number of combinations can be employed to more evenly distribute the plasma in accordance with the teaching of the present invention.

EXPERIMENTAL

A number of wafers were processed using the plasma generating apparatus of the present invention. These examples are offered by way of illustration and not by way of limitation.

Experiment 1

Semiconductor wafers were processed using a reactor as shown in FIG. 1a, having a plasma generating apparatus according to two different embodiments of the present invention: (1) the wide embodiment and (2) the hour-glass embodiment. Silicon dioxide ($SiO_2$) layers were deposited on the surface of a wafers using the following process conditions:

| | |
|---|---|
| Plasma generating apparatus: embodiment shield with | wide embodiment and hour-glass helical coil |
| Plasma generating source power: | 5 kW |
| Bias power: | 0, 1.25 and 2.45 kW |
| chamber pressure: | 5 mTorr |
| Gas flow: | Argon (Ar) @ 213 sccm |
| | Oxygen ($O_2$) @ 190 sccm |
| | Silane ($SiH_4$) @ 95 sccm |

Deposition results, the wet etch rate ratio (WEER), and the argon (Ar) sputter rate were evaluated.

The results are summarized below:

TABLE 1

| | | Deposition Results | | | | | | | |
|---|---|---|---|---|---|---|---|---|---|
| | Wide Embodiment | | | | | Hour-glass Embodiment | | | |
| rf. bias kW | dep rate A/min | uniformity % | RI-edge | RI-center | rf. bias kW | dep rate A/min | uniformity % | RI edge | RI center |
| 0 | 6530 | 3.28 | 1.4765 | 1.4783 | 0 | 6574 | 3.65 | 1.4766 | 1.4784 |
| 1.25 | 5324 | 3.5 | 1.4665 | 1.4644 | 1.25 | 5295 | 3.54 | 1.4664 | 1.4648 |
| 2.45 | 4508 | 4.29 | 1.4651 | 1.4651 | 2.45 | 4422 | 3.91 | 1.4624 | 1.4647 |

As shown in Table 1, silicon oxide layers were deposited both under conditions of no rf. bias and with rf. bias to the wafer support 20. The deposition rate, percent uniformity and refractive index (RI) were measured. Desirable results were achieved with both the wide and hourglass embodiments of the present invention.

The WERR was measured, and the results are presented in Table 2 below: The WEER is determined by dipping the sample wafer into a buffered acid bath for a fixed time, and then measuring the uniformity of the etch. The results give an indication of the film density, one of the qualities of the film deposition process.

TABLE 2

| | WEER | | | | |
|---|---|---|---|---|---|
| | Wide Embodiment | | | Hour-glass Embodiment | |
| rf. bias (kW) | WEER | Uniformity % | rf. bias (kW) | WEER | Uniformity % |
| 0 | 687 | 3.1 | 0 | 731 | 3.47 |
| 1.25 | 509 | 4.93 | 1.25 | 519 | 4.46 |
| 2.45 | 465 | 2.77 | 2.45 | 450 | 2.5 |
| THOX | 233 | — | THOX | 238 | — |

Next, the Ar sputter rate was evaluated and the results are shown in Table 3 below:

TABLE 3

| | Ar Sputter Rate | | | | |
|---|---|---|---|---|---|
| Wide Embodiment | | | Hour-glass Embodiment | | |
| rf. bias (kW) @5 mTorr Ar | sputter rate (A/min) | Uniformity % | rf. bias (kW) @5 mTorr Ar | sputter rate (A/min) | Uniformity % |
| 1.25 | 2748 | 10.6 | 1.25 | 2783 | 10.25 |

As shown, the two embodiments of the present invention provide desirable results with close correlation.

Experiment 2

A second set of experiments were performed which compare the deposition uniformity of films deposited on wafers using a plasma generating apparatus of the type (1) shown in the prior are ('529 patent), and (2) using a plasma generating apparatus in accordance with one embodiment of the present invention in which the openings 33 extend only around approximately one half of the circumference of the shield 19; thus, the other half of the circumference of the shield is solid and contains no openings (i.e. one half of the shield is "blanked off"). This embodiment can be considered an extreme case of an electrostatic shield 19 with asymmetrically placed openings. The "blanked off" section of the shield 19 was placed between the coil ground and the liner 27. Silicon dioxide layers were deposited on wafers using the process conditions stated in Experiment 1 for both the prior a shield and the apparatus of the present invention.

The thickness and uniformity of the deposited layers were measured using the Prometrix SpectraMap SM300 tool. Wafers processed using the plasma generating apparatus of the present invention exhibited a percent non-uniformity of 1.536%. Wafers processed using the conventional prior art plasma generating apparatus had a percent nonuniformity of 2.136%. Thus, the apparatus of the present invention provides an advantageous improvement in uniformity of films deposited on wafers.

Experiment 3

Figure 12:
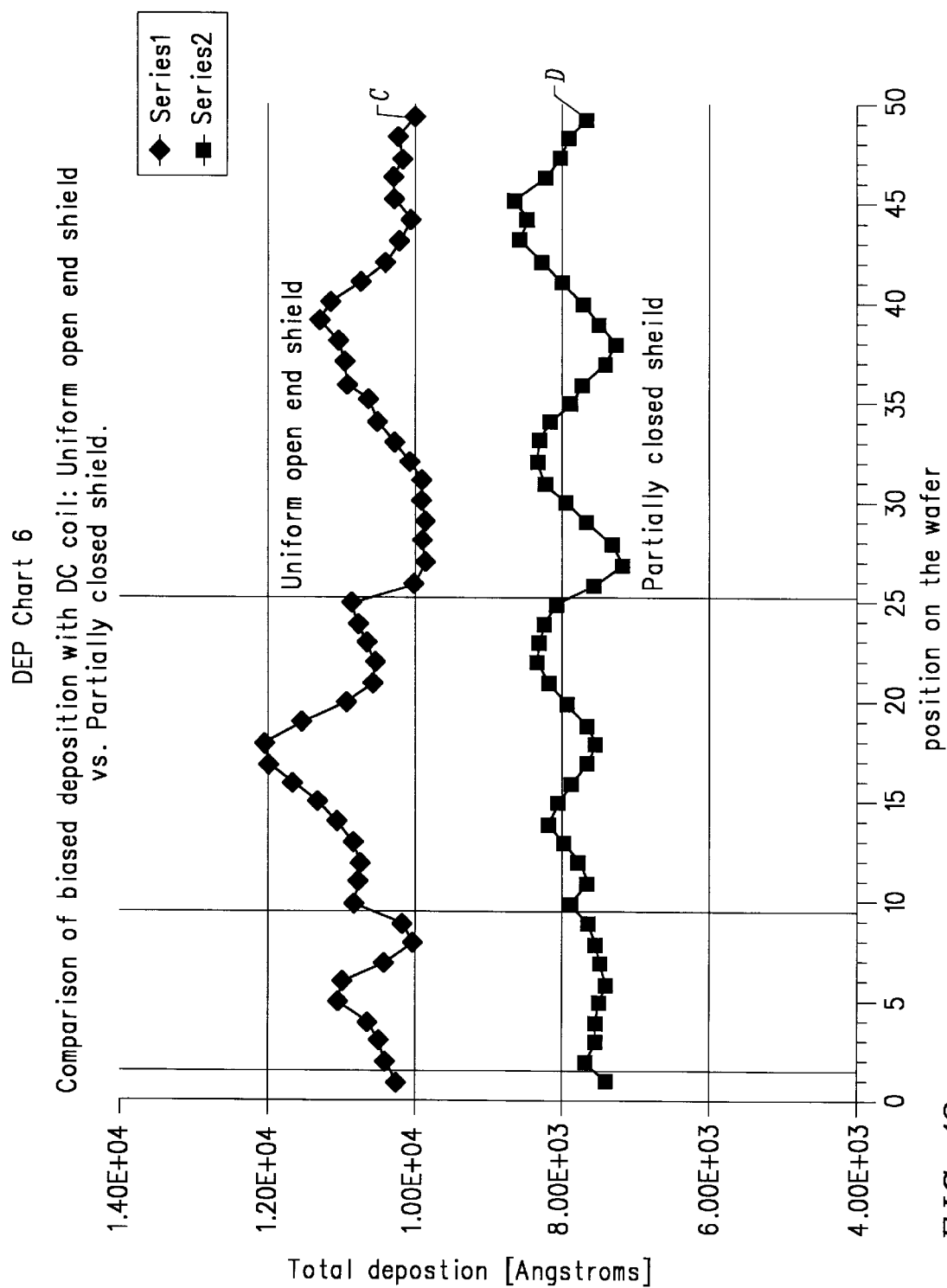
FIG. 12 is a graph plotting film deposition thickness as a function of position on wafers with films deposited thereon using a plasma generating source according to two embodiments of the present invention.

A third set of experiments were performed wherein deposition thicknesses and uniformity was measured for films deposited using the apparatus according to two different embodiments of the present invention. The results are shown in FIG. 12. Specifically, the apparatus used contained a plasma generating source having (1) the "open-ended" shield with uniformly distributed openings 33 placed around the circumference of the shield (results shown as line C on FIG. 11), and (2) a shield having a plurality of wide, uniformly distributed openings 33 formed therein (i.e. a closed-ended shield) and extending only around approximately one half of the circumference of the shield 19; thus, the other half of the circumference of the shield is solid and contains no openings (i.e. one half of the shield is "blanked off").

Silicon dioxide layers were deposited on wafers using the process conditions stated in Experiment 1 for both the prior a shield and the apparatus of the present invention. In FIG. 12 a graph plotting the film deposition thickness as a function of position is shown for wafers with films deposited thereon using these two embodiments of the plasma generating source. Of particular interest it is shown that the open-ended shield achieved a greater film thickness (see line C on FIG. 12) than the closed-ended shield. This increase in the film thickness is a result of a higher ion density achieved with the open-ended shield embodiment. The closed-ended shield, however, produced a film having better thickness uniformity (see line C on FIG. 12) than the open-ended shield. Thus, it is shown at the distribution of the openings may be configured to increase the uniformity of deposited film.

The foregoing description of specific embodiments of the invention have been presented for the purpose of illustration and description. They are not intended to be exhaustive or to limit the invention to the precise forms disclosed, and obviously many modifications, embodiments, and variations are possible in light of the above teaching. It is intended that the scope of the invention be defined by the claims appended hereto and their equivalents.

What is claimed:

1. A plasma generating apparatus for providing electromagnetic energy to generate a plasma, comprising:
   an enclosure having an inner plasma containing region and an outer region;
   a source of electromagnetic energy disposed within said outer region for generating a plasma within said plasma containing region; and
   an electrostatic shield disposed between said source of electromagnetic energy and said plasma containing region and being electrically connected to said enclosure, said electrostatic shield having a plurality of openings formed therethrough and configured to control the magnitude and distribution of electromagnetic energy coupled from said source into the plasma containing region, and the distribution of the plasma in the plasma containing region.

2. The plasma generating apparatus of claim 1 wherein the shield is cylindrical and the plurality of openings are spaced apart at substantially equal distance around the circumference of the shield, and wherein the openings create an exposed area of approximately up to 50 percent of the total area of the shield.

3. The plasma generating apparatus of claim 1 wherein the plurality of openings are each of substantially equal width.

4. The plasma generating apparatus of claim 1 wherein the plurality of openings have a width in the range of 0.06 to 0.63 inches.

5. The plasma generating apparatus of claim 1 wherein the plurality of openings have a width of approximately 0.62 inches.

6. The plasma generating apparatus of claim 1 wherein at least one of the plurality of openings vary in width.

7. The plasma generating apparatus of claim 1 wherein at least one of the plurality of openings vary in length.

8. The plasma generating apparatus of claim 1 wherein wherein the shield is cylindrical and the plurality of openings are spaced apart at varying distances around the circumference of the shield.

9. The plasma generating apparatus of claim 1 wherein the source of electromagnetic energy is a helical resonator.

10. The plasma generating apparatus of claim 1 wherein at least one of the plurality of openings comprises a narrow opening middle region between two wide opening regions to provide less capacitive coupling of the electromagnetic energy in the middle of the openings.

11. The plasma generating apparatus of claim 9 wherein the narrow opening region has a width of approximately 0.06 inches.

12. The plasma generating apparatus of claim 9 wherein one or both of the two wide opening regions have a width in the range of approximately 1.25 to 1.50 inches.

13. The plasma generating apparatus of claim 1 wherein the source of electromagnetic energy is a helical coil, and where the electrostatic shield has two end surfaces and where either both, or one of, said two end surfaces is grounded.

14. The plasma generating apparatus of claim 1 wherein the source of electromagnetic energy is a helical coil having a grounded end and an open end, and the electrostatic shield has a closed end surface and an open end surface wherein at least one of the plurality of openings extends all the way through the open end surface, said closed end surface being grounded and facing the open end of the helical coil.

15. The plasma generating apparatus of claim 1 wherein the electrostatic shield has two end surfaces, and the source of electromagnetic energy is a coil, wherein the coil extends axially beyond at least one of the end surfaces of the electrostatic shield.

16. The plasma generating apparatus of claim 1 wherein said apparatus is configured to reduce the magnitude of electric fields generated by the source of electromagnetic energy in the middle portion of the plasma containing region.

17. The plasma generating apparatus of claim 1 wherein said apparatus is configured to increase the ion density of the plasma in the plasma containing region.

18. The plasma generating apparatus of claim 1 wherein said apparatus is configured to substantially uniformly distribute the plasma in the plasma containing region.

19. The plasma generating apparatus of claim 1 wherein said apparatus is configured to self ignite.

20. The plasma generating apparatus of claim 1 wherein the plurality of openings create an exposed area in the range of approximately 5 to 50 percent of the total area of the shield.

21. The plasma generating apparatus of claim 1 wherein the plurality of openings create an exposed area of approximately leas than 40 percent of the total area of the shield.

22. The plasma generating apparatus of claim 1 wherein the plurality of openings create an exposed area in the range of approximately 15 to 40 percent of the total area of the shield.

23. The plasma generating apparatus of claim 1 wherein the plurality of openings create an exposed area of approximately 30 percent of the total area of the shield.

24. The plasma generating apparatus of claim 1 wherein the source of electromagnetic energy is a helical coil having a grounded end and an open end, and where the grounded end is placed proximate a wafer to be processed to increase the plasma density proximate said wafer.

25. A plasma generating apparatus for providing electromagnetic energy to generate a plasma, comprising:
a plasma containing region;
a source of electromagnetic energy for generating a plasma within said plasma containing region; and
an electrostatic shield being electrically referenced to a non-zero potential, and disposed between said source of electromagnetic energy and said plasma containing region, said electrostatic shield having a plurality of openings formed therethrough and configured to selectively control the manner in which electromagnetic energy is coupled from said source into the plasma containing region and the distribution of the plasma in the plasma containing region.

26. A plasma processing reactor, comprising:
a plasma chamber including an enclosure having an inner plasma containing region and an outer region;
a source of electromagnetic energy disposed within said outer region for generating a plasma within the plasma containing region;
an electrostatic shield disposed between said source of electromagnetic energy and said plasma containing region and being electrically attached to the enclosure, said electrostatic shield having a plurality of openings formed therethrough, and being configured to control the magnitude and distribution of electromagnetic energy coupled from said source into the plasma containing region and the distribution of the plasma in the plasma containing region;
a process chamber communicating with the plasma chamber whereby the plasma extends into said process chamber;
a wafer support for supporting a wafer, said wafer support disposed in said process chamber;
a gas manifold, disposed in said process chamber and encircling said wafer support, for directing gases towards said wafer support whereby the gases interact with the plasma to process the surface of a wafer supported on said wafer support; and
a vacuum system for removing gases from the bottom of said process chamber.

27. The reactor of claim 26 wherein the shield is cylindrical and the plurality of openings are spaced apart at substantially equal distance around the circumference of the shield and wherein the openings create an exposed area of approximately up to 50 percent of the total area of the shield.

28. The reactor of claim 26 wherein the plurality of openings are each of substantially equal width.

29. The reactor of claim 26 wherein the plurality of openings have a width in the range of 0.06 to 0.63 inches.

30. The reactor of claim 26 wherein the plurality of openings have a width of approximately 0.62 inches.

31. The reactor of claim 26 wherein at least one of the plurality of openings vary in width.

32. The plasma generating apparatus of claim 26 wherein at least one of the plurality of openings vary in length.

33. The reactor of claim 26 wherein wherein the shield is cylindrical and the plurality of openings are spaced apart at varying distances around the circumference of the shield.

34. The reactor of claim 26 wherein the source of electromagnetic energy is a helical resonator.

35. The reactor of claim 26 wherein at least one of the plurality of openings comprises a narrow opening middle region between two wide opening regions to provide less coupling of the electromagnetic energy in the middle of the openings.

36. The reactor of claim 35 wherein the narrow opening region has a width of approximately 0.06 inches.

37. The reactor of claim 35 wherein the two wide opening regions have a width in the range of 1.25 to 1.50 inches.

38. The plasma generating apparatus of claim 26 wherein the source of electromagnetic energy is a helical coil, and where the electrostatic shield has two end surfaces and where either both, or one of, said two end surfaces is grounded.

39. The plasma generating apparatus of claim 26 wherein the source of electromagnetic energy is a helical coil having a grounded end and an open end, and the electrostatic shield has a closed end surface and an open end surface wherein and at least one of the plurality of openings extends all the way through the open end surface, said closed end surface being grounded and facing the open end of the helical coil.

40. The reactor of claim 26 wherein said reactor is configured to reduce electric fields in the middle portion of the plasma containing region.

41. The reactor of claim 26 wherein said reactor is configured to increase the ion density of the plasma in the plasma containing region.

42. The reactor of claim 26 wherein said reactor is configured to substantially uniformly distribute the plasma in the plasma containing region.

43. The reactor of claim 26 wherein said reactor is configured to self ignite.

44. The reactor of claim 26 wherein the electrostatic shield has two end surfaces and at least one of the plurality of openings extends all the way through one of the end surfaces.

45. The reactor of claim 26 wherein the electrostatic shield has two end surfaces, and the source of electromagnetic energy is a coil, wherein the coil extends axially beyond at least one of the end surfaces of the electrostatic shield.

46. The plasma processing reactor of claim 26 wherein the source of electromagnetic energy is a helical coil having a grounded end and an open end, and where the grounded end is placed proximate said wafer to be processed to increase the plasma density proximate said wafer.

47. A plasma generating apparatus for providing electromagnetic energy to generate a plasma, comprising:

an enclosure having an inner plasma containing region and an outer region;

a source of electromagnetic energy disposed within said outer region for generating a plasma within said plasma containing region; and an electrostatic shield disposed between said source of electromagnetic energy and said plasma containing region and being electrically connected to said enclosure, said electrostatic shield having a plurality of openings formed therethrough and configured to control the magnitude and distribution of electromagnetic energy coupled from said source into the plasma containing region, wherein the plurality of openings are spaced apart around the circumference of the shield, and the openings create an exposed area of approximately up to 50 percent of the total area of the shield.

48. A plasma generating apparatus for providing electromagnetic energy to generate a plasma, comprising:

an enclosure having an inner plasma containing region and an outer region;

a source of electromagnetic energy disposed within said outer region for generating a plasma within said plasma containing region; and an electrostatic shield disposed between said source of electromagnetic energy and said plasma containing region and being electrically connected to said enclosure, said electrostatic shield having a plurality of openings formed therethrough and configured to control the magnitude and distribution of electromagnetic energy coupled from said source into the plasma containing region, wherein at least one of the plurality of openings includes a narrow opening middle region between two wide opening regions, to provide less capacitive coupling of electromagnetic energy in the middle of the openings.

49. A plasma generating apparatus for providing electromagnetic energy to generate a plasma, comprising:

an enclosure having an inner plasma containing region and an outer region;

a source of electromagnetic energy disposed within said outer region for generating a plasma within said plasma containing region; and an electrostatic shield having end surfaces and disposed between said source of electromagnetic energy and said plasma containing region and being electrically connected to said enclosure, said electrostatic shield having a plurality of openings formed therethrough and configured to control the magnitude and distribution of electromagnetic energy coupled from said source into the plasma containing region, wherein at least one of the plurality of openings extends all the way through one of said end surfaces of the electrostatic shield.

\* \* \* \* \*